(12) United States Patent  (10) Patent No.: US 8,327,090 B2
Jones et al.  (45) Date of Patent: Dec. 4, 2012

(54) HISTOGRAM GENERATION WITH MIXED BINNING MEMORY

(75) Inventors: Michael Frank Jones, Santa Clara, CA (US); Eric Barr Kushnick, Santa Clara, CA (US)

(73) Assignee: Advantest Corporation, Tokyo (JP)

( * ) Notice: Subject to any disclaimer, the term of this patent is extended or adjusted under 35 U.S.C. 154(b) by 1443 days.

(21) Appl. No.: 11/876,687

(22) Filed: Oct. 22, 2007

(65) Prior Publication Data

US 2009/0106512 A1  Apr. 23, 2009

(51) Int. Cl.
*G06F 12/00* (2006.01)

(52) U.S. Cl. .......................................... 711/155

(58) Field of Classification Search .................. None
See application file for complete search history.

(56) References Cited

U.S. PATENT DOCUMENTS 6,073,263 A * 6/2000 Arkin et al. .................... 714/738
2010/0011252 A1 * 1/2010 Rivoir ............................. 714/32

* cited by examiner

*Primary Examiner* — Brian Peugh
(74) *Attorney, Agent, or Firm* — Morrison & Foerster LLP

(57) ABSTRACT

Memory is divided up during the gathering of histogram data so that a portion of the memory is configured for storing the high counts expected at the minimum and maximum codes/addresses, and at least one other portion is configured for storing the lower counts expected at other codes/addresses. By configuring memory portions in this manner, memory can be more efficiently allocated.

18 Claims, 3 Drawing Sheets

HISTOGRAM GENERATION WITH MIXED BINNING MEMORY

FIELD OF THE INVENTION

This invention relates to the generation of histograms, and more particularly, to dividing up memory during the gathering of histogram data so that a portion of the memory is configured for storing the high counts expected at the minimum and maximum codes/addresses, and at least one other portion is configured for storing the lower counts expected at other codes/addresses.

BACKGROUND OF THE INVENTION

Certain semiconductor devices capable of generating a semi-predictable multi-bit output in response to a known input stimulus can be tested by applying the known stimulus over a fixed period of time, and capturing the number of occurrences of particular multi-bit outputs during that time. Each particular multi-bit output being monitored may be referred to as a "bin," and the number of counts in each bin at the conclusion of the fixed test period can be used to generate a histogram. The histogram can be used in various ways (e.g. numerical analysis) to determine if the device under test (DUT) is acceptable or not, or determine performance parameters.

One such device capable of being tested in the above-described manner is an ADC. An ADC generates a multi-bit output (also referred to herein as a "code") in response to an analog input signal. A common input stimulus used for testing ADCs is a sine wave, which is relatively easily generated in a "clean" manner (substantially free of spurious frequencies). When the sine wave is applied to the input of the ADC, the input signal varies between a minimum and maximum analog voltage level, and the ADC outputs a multi-bit digital signal in accordance with the analog voltage level. Over time, a histogram can be generated indicative of the acceptability of the ADC.

FIG. 1a illustrates an exemplary block diagram of a high level perspective of test system 100 that may be used to test DUTs and generate histograms as described above. It should be emphasized that FIG. 1a is only exemplary, and that many other test system configurations well-understood to those skilled in the art may also be used. In FIG. 1a, modules 102 may be functional units such as a reference generator, a digital pincard, an analog card, a device power supply (DPS), or instruments such as a waveform generator. The physical connections to modules 102 may be obtained through module connection enabler 104 that includes switch matrix network 106. Switch matrix network 106 may include logic, traces, and pins.

System controller 108 is typically the point of interaction for a user. System controller 108 provides a gateway to site controllers 110 and synchronization of the site controllers in a multi-site/multi-DUT environment. A system controller 108 and multiple site controllers 110 may operate in a master-slave configuration. System controller 108 controls the overall system operation and determines that functions that a particular site controller 110 should perform. Each site controller 110 is itself sufficient to test DUT 112. Site controller 110 controls and monitors the operation of various modules 102 within test site 114. Test site 114 is a collection of modules 102 that service the testing of a single DUT 112. Site controller 110 can control one or multiple test sites 114.

As described above, an input stimulus such as a sine wave may be supplied from a reference generator module (one of the modules 102 in test site 114) to DUT 112. A multi-bit output from the DUT can be fed back to another module 102, where a count of each multi-bit output received from the DUT is accumulated.

FIG. 1b illustrates exemplary test site 114 and DUT 112 in greater detail. In FIG. 1b, DUT 112 is an ADC, and module 102_A generates a sine wave that is fed into the input of the ADC. The ADC generates an N-bit digital output, which is connected to the address line of memory 116 within module 102_B. At every sample of the ADC, the N-bit digital output addresses memory 116, and the count stored at that address is read out, modified (incremented by one), and written back to that address (a read-modify-write or RMW cycle). As shown by exemplary plot 118, in a typical ADC, a sine wave input will result in a nonlinear distribution of counts, with a high number of counts at a small number of minimum and maximum codes/addresses (corresponding to the minimum and maximum values of the sine wave, where the sine wave inflects), and a low number of counts at a large majority of the other addresses (corresponding to those regions where the sine wave is transitioning from low-to-high or from high-to-low). The high number of counts may be hundreds or thousands of times higher than the low number of counts.

If a single memory is used to maintain the counts for all codes/addresses, each address in that memory (i.e. each bin) must be capable of counting up to the maximum number of occurrences expected for any address during the test. In other words, each bin must be capable of storing the highest count expected in any of the bins. This configuration is wasteful of memory resources, however, because as plot 118 demonstrates, most of the bins will store a much lower count.

Therefore, there is a need to organize memory to more efficiently store the expected counts when gathering data for a histogram.

SUMMARY OF THE INVENTION

Embodiments of the invention are directed to dividing up the memory during the gathering of histogram data so that a portion of the memory is configured for storing the high counts expected at the minimum and maximum codes/addresses, and at least one other portion is configured for storing the lower counts expected at other codes/addresses. By configuring memory portions in this manner, memory can be more efficiently allocated.

The first memory may contain fewer bins (addresses) than the second memory, but the first memory can have more data bits associated with each address (a larger word width or "deeper" memory) as compared to the second memory (a smaller word width or "shallower" memory) so that the first memory can hold a high number of counts. Thus, the first memory is suitable for storing the counts of the lowest and highest bins, which are expected to receive high counts, while the second memory is suitable for storing the counts of the large majority of bins between the lowest and highest bins, which are expected to receive low counts. In this manner, the overall memory allocation is made more efficient because the second memory need not be as deep as the first memory, and thus less memory is wasted.

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the preferred embodiments of the present invention.

Embodiments of the invention are directed to dividing up the memory during the gathering of histogram data so that a portion of the memory is configured for storing the high counts expected at the minimum and maximum codes/addresses, and at least one other portion is configured for storing the lower counts expected at other codes/addresses. By configuring memory portions in this manner, memory can be more efficiently allocated.

A configurable decoder may be used to receive the output or code from a device and depending on its value, route the code to either a first memory or a second memory. A configurable decoder allows different types of input stimuli to be provided, or to allow for different types of ADCs that employ different encoding schemes, such as two's complement, sign and magnitude, straight binary, and the like.

The first memory may contain fewer bins (addresses) than the second memory, but the first memory can have more data bits associated with each address (a larger word width or "deeper" memory) as compared to the second memory (a smaller word width or "shallower" memory) so that the first memory can hold a high number of counts. Thus, the first memory is suitable for storing the counts of the lowest and highest bins, which are expected to receive high counts, while the second memory is suitable for storing the counts of the large majority of bins between the lowest and highest bins, which are expected to receive low counts. In this manner, the overall memory allocation is made more efficient because the second memory need not be as deep as the first memory, and thus less memory is wasted.

It should be understood that although the present invention may be described herein in the context of testing one or more ADCs being driven with sine waves for purpose of illustration only, embodiments of the present invention are applicable to any device capable of generating a predictable multi-bit output in response to any known input stimulus, and are also applicable to the gathering of histogram data in non-test situations as well.

Figure 1A:
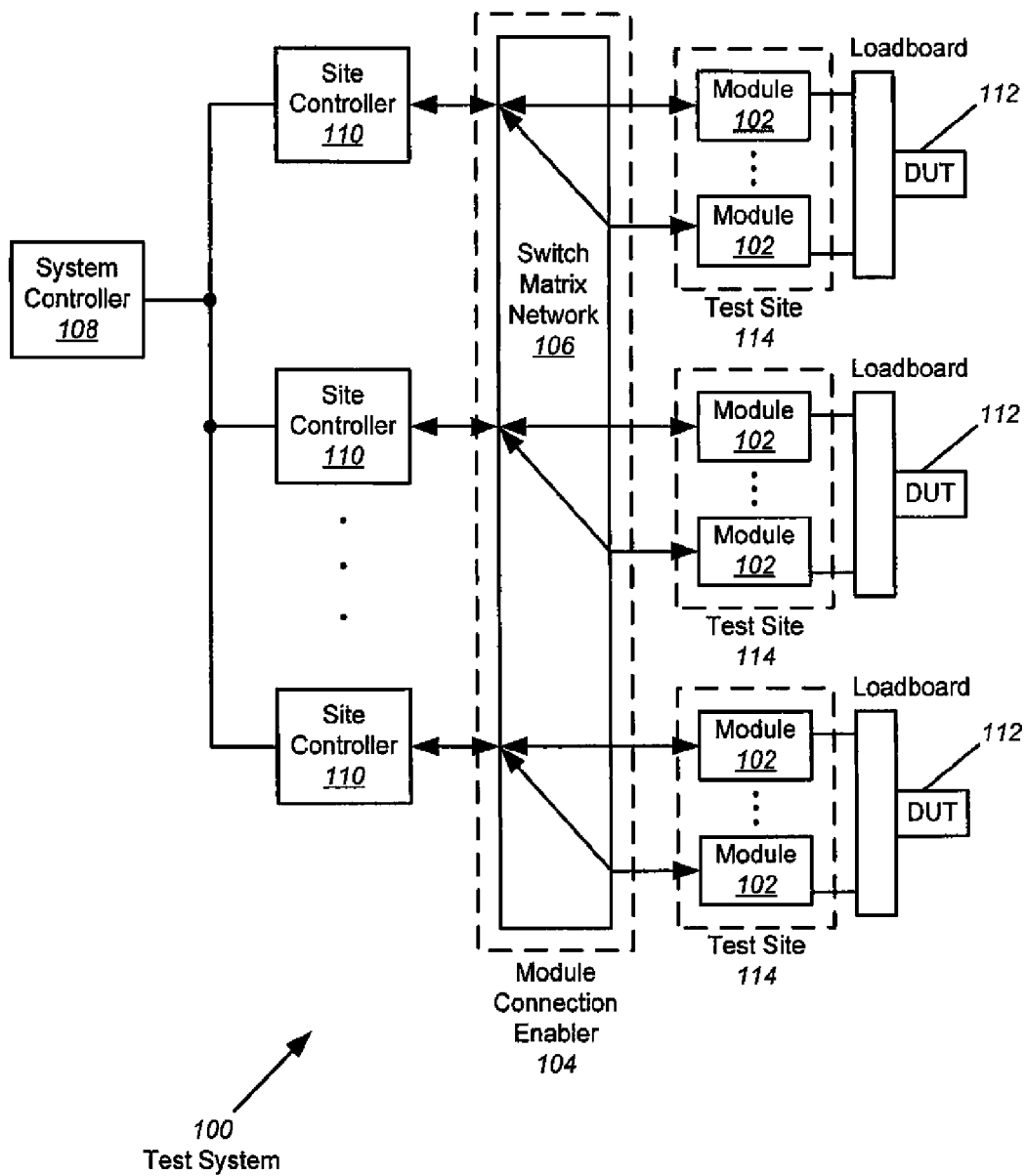
FIG. 1a illustrates an exemplary block diagram of a test system that may be used to test DUTs and generate histograms.
Figure 1B:
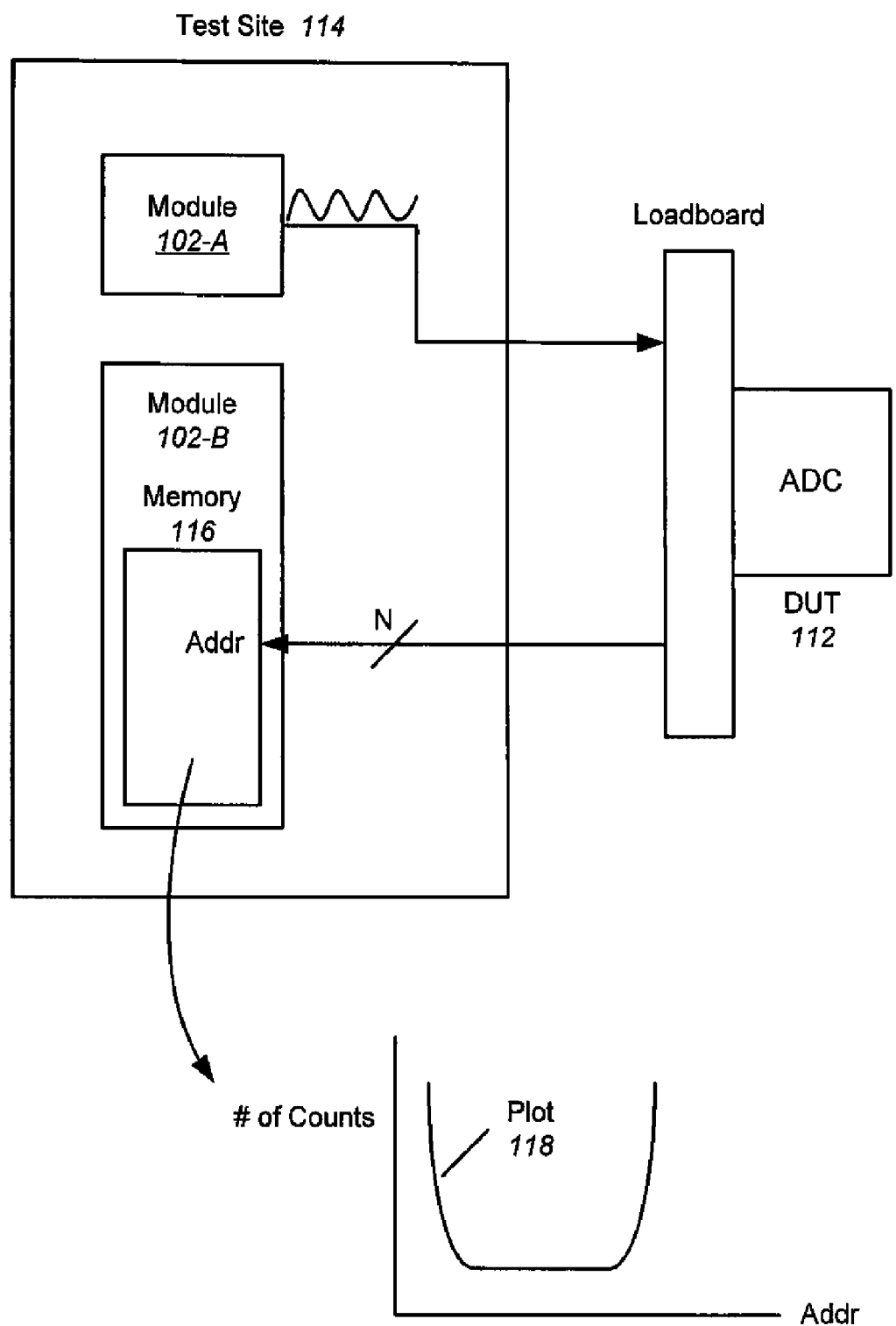
FIG. 1b illustrates an exemplary test site including modules for generating a sine wave and counting the number of occurrences of particular output codes.
Figure 2:
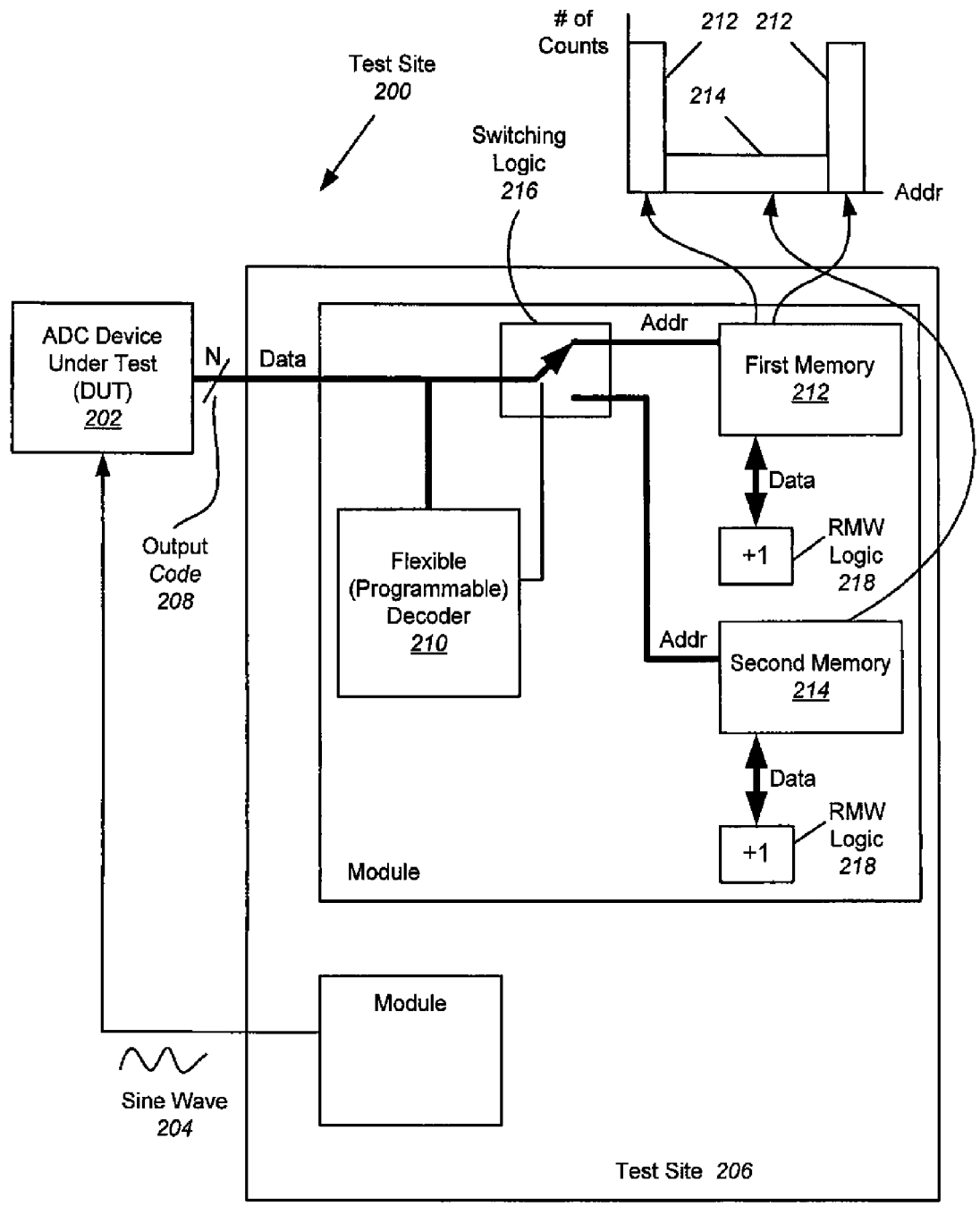
FIG. 2 illustrates an exemplary test site for gathering histogram data according to embodiments of the invention.

FIG. 2 illustrates exemplary test site 200 for gathering histogram data according to embodiments of the invention. In FIG. 2, ADC 202 receives a sine wave 204 from test site 206, and generates N-bit output code 208. A configurable decoder 210 receives code 208 and depending on its value, routes the code to either first memory 212 or second memory 214 using switching logic 216. Note that decoder 210 is configurable to allow different types of input stimuli to be provided, or to allow for different types of ADCs that employ different encoding schemes, such as two's complement, sign and magnitude, straight binary, and the like. In the example of FIG. 2, decoder 210 would route the lowest and highest codes to first memory 212, and route all other codes to second memory 214.

First memory 212 may contain fewer bins (addresses) than second memory 214, but the first memory has more data bits associated with each address (a larger word width or "deeper" memory) as compared to second memory 214 (a smaller word width or "shallower" memory) so that the first memory can hold a high number of counts. Thus, first memory 212 is suitable for storing the counts of the lowest and highest bins, which are expected to receive high counts, while second memory 214 is suitable for storing the counts of the large majority of bins between the lowest and highest bins, which are expected to receive low counts. In this manner, the overall memory allocation is made more efficient because second memory 214 need not be as deep as first memory 212, and thus less memory is wasted.

In some embodiments, first memory 212 may be "internal," combined with other logic in a single device such as a gate array, and relatively fast as compared to second memory 214, which may be external to the device and be relatively slow (e.g. a DRAM). In other embodiments, both first and second memories 212 and 214 may be internal to a single larger device, allowing for faster performance. A faster memory for the bins with higher expected counts can be beneficial, because those bins may receive multiple occurrences in consecutive samples, requiring the memory to perform multiple consecutive time-consuming RMW cycles. RMW logic 218 associated with each of first and second memories 212 and 214 perform the RMW function each time the memory is addressed.

It should also be noted that although FIG. 2 shows only two memories for purposes of illustration only, three or more memories could also be employed, each memory configured to be of a certain depth to store the counts for certain bins. Decoder 210 and switching logic 216 (together referred to as decoding logic) can be extended in a straightforward manner well-understood to those skilled in the art and configured to route the codes to any or the three or more memories.

In addition, it should be noted that the use of decoder 210 and switching logic 216 as shown in FIG. 2 is only exemplary, and that other logic designs easily produced by those skilled in the art may be employed to achieve the same result, which is to configure multiple memory segments to gather histogram data for either a single ADC or multiple ADCs. It should also be understood by those skilled in the art that FIG. 2 is simplified for purposes of clarity, and that various elements such as a clock distribution network to the decoder, RMW logic and memories, and access paths to the memories so that histogram results can be retrieved, are not shown in the figures. In addition, a mechanism for clearing the memories is needed to clear them prior to the start of a test.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. An apparatus for gathering histogram data from a device under test (DUT), comprising:
   a first memory configured for receiving a digital output from the DUT as an address and performing a read-modify-write (RMW) cycle on a count stored at that address;

a second memory configured for receiving the digital output from the DUT as an address and performing a RMW cycle on the count stored at that address, the first memory having fewer addressable locations than the second memory but capable of storing a higher count than the second memory; and a decoder coupled to the first and second memories and configured for receiving the digital output from the DUT and selectively routing the digital output to either the first memory or the second memory based on an expected number of occurrences of the digital output during a test period.

2. The apparatus of claim 1, wherein the decoder is configured for routing the digital output to the first memory for those digital outputs for which a high number of occurrences are expected during the test period, and routing the digital output to the second memory for those digital outputs for which a low number of occurrences are expected during the test period.

3. The apparatus of claim 1, wherein the first memory is fast access memory and the second memory is slower access memory.

4. The apparatus of claim 1, wherein the first memory is internal to an integrated circuit and the second memory is external to the integrated circuit.

5. The apparatus of claim 1, wherein the decoder is programmable to enable the digital output to be routed to either the first or second memory based on an expected number of occurrences of the digital output as determined by a type of DUT or a type of input stimulus provided to the DUT.

6. The apparatus of claim 1, wherein the DUT is an analog to digital converter (ADC) and the input to the ADC is a sine wave, and the decoder is configured for routing the digital output to the first memory for lowest and highest digital outputs corresponding to inflection points of the sine wave, and routing the digital output to the second memory for all other digital outputs.

7. A test site comprising the apparatus of claim 1.

8. A test system comprising the test site of claim 7.

9. An apparatus for gathering histogram data from a device under test (DUT), comprising:

two or more memories, each memory configured for receiving a digital output from the DUT as an address and performing a read-modify-write (RMW) cycle on a count stored at that address, and each memory having a combination of addressable locations (width) and bits at those locations (depth) corresponding to one or more digital outputs having a particular expected number of occurrences during a test period; and a decoder coupled to the two or more memories and configured for receiving the digital output from the DUT and selectively routing the digital output to one of the two or more memories based on the expected number of occurrences of the digital output.

10. The apparatus of claim 9, wherein the decoder is programmable to enable the digital output to be routed to one of the two or more memories based on the expected number of occurrences of the digital output as determined by the type of DUT or the type of input stimulus provided to the DUT.

11. A method for gathering histogram data from a device under test (DUT), comprising:

receiving a digital output from the DUT and selectively routing the digital output to an address of either a first memory or a second memory based on an expected number of occurrences of the digital output during a test period, the first memory having fewer addressable locations than the second memory but capable of storing a higher count than the second memory; and performing a read-modify-write (RMW) cycle on a count stored at that address.

12. The method of claim 11, further comprising routing the digital output to the first memory for those digital outputs for which a high number of occurrences are expected during the test period, and routing the digital output to the second memory for those digital outputs for which a low number of occurrences are expected during the test period.

13. The method of claim 11, wherein the first memory is fast access memory and the second memory is slower access memory.

14. The method of claim 11, wherein the first memory is internal to an integrated circuit and the second memory is external to the integrated circuit.

15. The method of claim 11, further comprising routing the digital output to either the first or second memory based on the expected number of occurrences of the digital output as determined by a type of DUT or a type of input stimulus provided to the DUT.

16. The method of claim 11, wherein the DUT is an analog to digital converter (ADC) and the input to the ADC is a sine wave, the method further comprising routing the digital output to the first memory for lowest and highest digital outputs corresponding to inflection points of the sine wave, and routing the digital output to the second memory for all other digital outputs.

17. A method for gathering histogram data from a device under test (DUT), comprising:

receiving a digital output from the DUT;

selectively routing the digital output to an address line of one of two or more memories based on the expected number of occurrences of the digital output, each memory having a combination of addressable locations (width) and bits at those locations (depth) corresponding to one or more digital outputs having a particular expected number of occurrences during a test period; and performing a read-modify-write (RMW) cycle on a count stored at that address.

18. The method of claim 17, further comprising routing the digital output to one of the two or more memories based on the expected number of occurrences of the digital output as determined by the type of DUT or the type of input stimulus provided to the DUT.

* * * * *